LIMITER CIRCUIT EMPLOYING SHUNT DIODE MEANS TO SWEEP OUT DISTRIBUTED CAPACITANCE IN THE NON-CONDUCTING STATE

Filed June 24, 1959

INVENTOR.
PETER G. SMEE
BY Isidore Match
ATTORNEY

United States Patent Office 3,020,420

Patented Feb. 6, 1962

3,020,420

LIMITER CIRCUIT EMPLOYING SHUNT DIODE MEANS TO SWEEP OUT DISTRIBUTED CAPACITANCE IN THE NON-CONDUCTING STATE

Peter G. Smee, Lynchburg, Va., assignor to General Electric Company, a corporation of New York Filed June 24, 1959, Ser. No. 822,502

9 Claims. (Cl. 307—88.5)

This invention relates to clipping circuits. More particularly it relates to such improved circuits advantageously utilizable for sharply clipping abrupt wave forms or high frequency waves.

In conventional diode clipper circuits in which the diode appears as a shunt element, the input and the output are separated by a large impedance during the time that the signal is transmitted. Also, in this type circuit the impedance of the reference voltage has to be kept low. In clipper circuits wherein the diode appears as a series element, the connection between the input and the output is direct and the impedance of the reference voltage need not be kept low since the output resistance is usually quite large. For these reasons the type of clipping circuit in which the diode appears as a series element is usually the preferred and most readily adaptable type.

However, the latter type circuits have the disadvantage that, at high frequencies or for abrupt wave forms, the distributed capacitance shunting the diode may provide a coupling path when the diode is at cut-off. The effect of this capacitance in clipping circuits intended for use at high frequencies is to make the attaining of sharp clipping quite difficult.

Accordingly, it is an object of the invention to provide an improved clipping circuit which clips sharply waves of high frequencies and having abrupt wave forms.

It is a further object of the invention to provide a circuit as in the preceding object wherein diodes are utilized as the switching elements.

Generally speaking, and in accordance with the invention, there is provided a clipping circuit comprising series connected unidirectional conducting means having an input and an output, the conducting means being poled and having an operating point so as to be conductive in response to inputs thereto having excursions in one direction from the operating point and to be non-conductive in response to inputs thereto having excursions from the operating point in the opposite direction. A load is provided in the output of the conducting means which presents a relatively high impedance to current flow when the conducting means is in the conducting state and a low impedance when the conducting means is in the non-conducting state.

The features of this invention, which are believed to be new, are set forth with particularity in the appended claims. The invention itself, however, may best be understood by referenec to the following description when taken in conjunction with the accompanying drawing which shows embodiments of a clipping circuit according to the invention.

Figure 1:
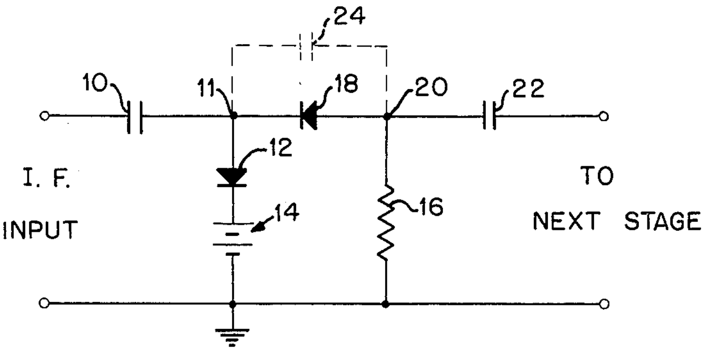
FIG. 1 is a schematic depiction of a known clipping circuit which may be utilized, for example, to clip an intermediate frequency carrier wave in a radio receiver when the latter is to be detected and utilized for automatic gain control.

Referring now to FIG. 1, there is shown a known circuit which is often used to clip the intermediate frequency wave used for automatic gain control detection. Such clipping is done because automatic gain control circuits used in communication systems receivers frequently have a very high gain even though the useable control voltage range is quite small. In such cases, it is desirable to clip the intermediate frequency signal that is used for the automatic gain control detection in a device which produces no output until the intermediate frequency signal exceeds a predetermined value.

The intermediate frequency input signal is applied through a capacitor 10 between ground and the junction point 11 of a diode 12 and capacitor 10. The anode of diode 12 is connected to the junction point 11 and the cathode of diode 12 is connected to the positive terminal of a unidirectional potential source 14, the negative terminal of source 14 being returned to ground.

If diode 12 is a crystal diode, then the combination of capacitor 10, diode 12 and source 14 forms a clamp circuit since diode 12 has a reverse resistance, that is, resistance in the direction in which the diode is least conductive, which is finite whereby, when diode 12 is rendered non-conductive, capacitor 10 has a resistance through which it can discharge. Of course, if diode 12 is a vacuum tube diode, then to provide a clamp circuit, it is preferable to provide a relatively high resistance in shunt with the series combination of diode 12 and source 14, since an open circuit in a vacuum tube diode has substantially an infinite resistance. Thus, in accordance with the operation of positive clamps, the input intermediate frequency signal appearing at junction point 11 is clamped to the voltage of potential source 14. The term "clamping" is intended to indicate the placing of a point in the circuit at a voltage from which it cannot depart appreciably.

Connected in shunt with the series arrangement of diode 12 and source 14 is a resistor 16 having one end connected to ground, the diode 18 being provided between junction point 11 and the other end of resistance 16, the latter junction point being designated by numeral 20. Diode 18 has its anode connected to point 20 and its cathode connected to junction point 11. The output of the circuit is provided at junction point 20 through a capacitor 22.

In considering the operation of the circuit of FIG. 1, let it be assumed that the voltage at source 14 is greater than the positive excursions from ground of the input intermediate frequency signal but less than the peak to peak voltage of the intermediate frequency input signal. Thus, the combination of capacitor 10 and the series arrangement of diode 12 and source 14 serve to clamp the input signal at the voltage of source 14 and since in this explanatory example, the peak to peak voltage has been chosen to be greater than the voltage of source 14 but the positive excursion of the input signal has been chosen to be less than the voltage of source 14, when the input signal is clamped, a small part of its negative going portion will be negative with respect to ground. While the potential at junction point 11 remains above ground or just slightly below it diode 18 is non-conductive. At the time that the most negative portion of the input signal swings below ground, diode 18 does conduct and a current flows from ground through resistor 16 and diode 18 to junction point 11. During the period of the latter current flow, an output signal is developed across resistor 16 which is coupled through capacitor 22 to the next succeeding stage (not shown).

At commonly used intermediate frequencies, the distributed capacitance depicted by the dashed line and the dashed configuration of capacitance 24 may present a quite small impedance so that some signal may be coupled therethrough to appear across resistor 16 when diode 18 is in the non-conducting state. In other words, some signal will appear at junction point 20 even when the peak to peak voltage of the input signal as clamped at junction point 11 does not exceed the voltage of source 14.

Figures 2, 3:
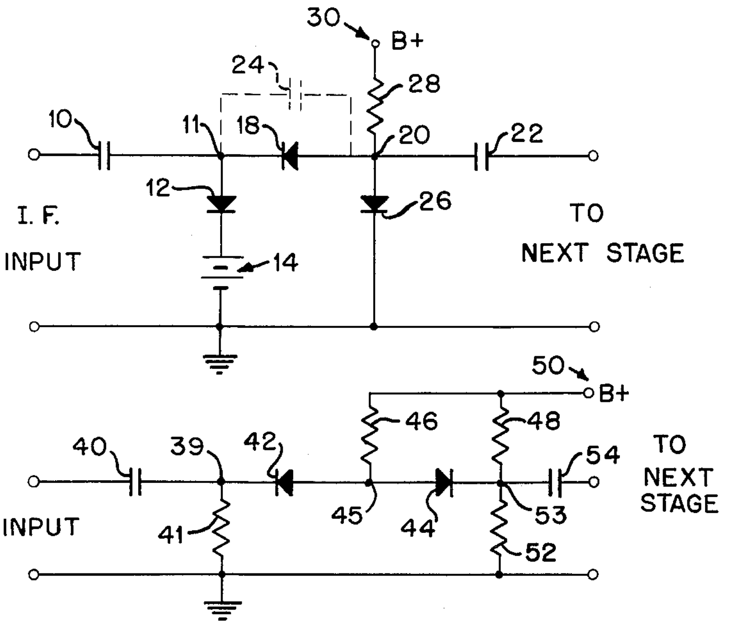
FIG. 2 is a diagram of a clipping circuit in accordance with the principles of the invention advantageously utilizable for the same purpose as the circuit of FIG. 1.
FIG. 3 shows a known circuit which is used as a limiter or peak clipper.

In FIG. 2 wherein there is shown an embodiment of a circuit in accordance with the invention, resistance 16 of FIG. 1 has been replaced with a diode 26, diode 26 having its cathode connected to ground and its anode connected to a B+ source 30 through a resistor 28. Since the other elements are the same as those shown in the circuit of FIG. 1, they have received the same corresponding designating numerals.

In considering the operation of the circuit of FIG. 2, the combination of capacitor 10 and the series arrangement of diode 12 and voltage source 14 operates to clamp the input signal appearing at junction point 11 to the voltage of source 14. Until the voltage at point 11 exceeds the voltage at source 14, diode 18 remains non-conductive. Simultaneously, diode 26 is conductive due to its connection to B+ source 30 through resistor 28, it effectively functioning to clamp junction point 20 at substantially ground potential. Now, when a clamped input appears at junction point 11 wherein the peak to peak voltage exceeds the voltage of source 14, that negative going portion which exceeds the latter voltage is an excursion below ground potential and during such excursion junction point 11 becomes negative with respect to junction point 20 and diode 18 conducts. This negative excursion at the time that diode 18 conducts causes the potential at junction point 20 correspondingly to drop below ground potential whereby diode 26 is rendered non-conductive, the voltage appearing across diode 26 during its non-conductive period being coupled as the output signal into the next stage through capacitor 22. It is thus appreciated that for the arrangement of the circuit of FIG. 2 wherein diode 26 presents a very low impedance to current flow when diode 18 is non-conductive and a high impedance to current flow when diode 18 is conductive, the coupling of the signal through the distributed capacitance 24 which takes place in the circuit of FIG. 1 is substantially eliminated in the circuit of FIG. 2.

The circuit depicted in FIG. 3 is a circuit well known in the art which is utilized as a limiter or a peak clipper. The circuit comprises a pair of diodes 42 and 44, the respective anodes of diodes 42 and 44 being conected to a source of unidirectional potential 50 through a suitable resistor 46, the cathode of diode 44 also being connected to the B+ source through a resistor 48. Connected between the junction point of the cathode of diode 44 and resistor 48 and ground is a resistor 52 across which the output of the circuit is developed and coupled to the next succeeding stage through a blocking capacitor 54. The input signal is applied through a capacitor 40 and developed across a resistor 41.

In considering the operation of the circuit of FIG. 3, it is seen that the anodes of diodes 42 and 44 are normally biased quite positive and the cathodes are also positive with respect to ground and in the absence of an applied signal, these diodes are normally conductive. Let it be assumed that a signal positive going with respect to ground is applied to the circuit. In this situation, diode 42 remains conductive until junction point 39 becomes positive with respect to junction point 45 at which point diode 42 is rendered non-conductive. During the time that diode 42 is conductive, diode 44 is also conductive and the signal coupled to the next stage through capacitor 54, which appears at junction 53 is the clipped positive going signal. Now, when a signal is applied to the circuit which is negative going with respect to ground, diode 42 remains conductive throughout the total duration of the latter signal but diode 44 is rendered nonconductive at the time that junction point 45 becomes negative with respect to junction point 53. Thus, the output developed across resistor 52 with the application of the negative signal is clipped at its negative peak. In this circuit, the series combination of resistors 48 and 52 of necessity has to be of a relatively high value to avoid loading the signal source. Also, similar to the circuit of FIG. 1, when the diodes are at cut-off, the inherent distributed capacitances, respectively in shunt therewith will cause unwanted signals to be coupled into the output.

Figure 4:
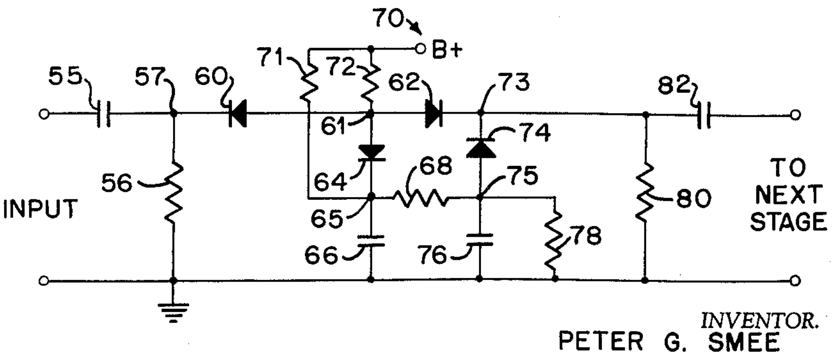
FIG. 4 shows a circuit in accordance with the invention which may also be used as a limiter or peak clipper.

In FIG. 4 there is shown an embodiment in accordance with the principles of the invention of a circuit advantageously utilizable as a limiter or peak clipper and wherein there is overcome the deleterious effects of the diode distributed capacitances as are present in the circuit of FIG. 3. The circuit comprises a pair of series connected diodes 60 and 62, each of the diodes having their anodes connected to a source of unidirectional potential 70 through a resistor 72. The input signal to the circuit is applied through capacitor 55 and developed across resistor 56 the cathode of diode 60 being connected to the junction point 57 of capacitor 55 and resistor 56. Connected between resistor 72 and source of reference potential, viz., ground, is a series combination of a diode 64 and a capacitor 66, the anode of diode 64 being connected to the junction point 61 of the anodes of diodes 60 and 62, the cathode of diode 64 being connected to the high side of capacitor 66. The junction 65 of diode 64 and capacitor 66 is connected to source 70 through a resistor 71. Connected in shunt with the series combination of diode 64 and capacitor 66 is a series combination of a diode 74 and a capacitor 76, the junction point 75 of the anode of diode 74 and the high side of capacitor 76 being connected to junction point 65 through a resistor 68 and thence to source 70 through resistor 71. The junction 75 of diode 74 and capacitor 76 is also connected to ground through a resistor 78. The output of the circuit appears across resistor 80 and is coupled to the next stage through a blocking capacitor 82.

In considering the operation of the circuit of FIG. 4, anodes of diodes 60, 62, and 64 are normally biased positive with respect to ground in the quiescent state and thus are normally in the conductive state when the circuit is quiescent. Diode 74 is biased so that it is normally in the non-conductive state and is rendered conductive only when a sufficiently negative input is applied to the circuit. Capacitors 66 and 76 serve as filtering elements for bypassing any unwanted alternating currents to ground. If it is assumed that an input appears at junction 57 which is positive, diode 60 will be rendered non-conductive at the voltage level that junction point 57 becomes positive with respect to junction point 61 and any portion of the input which has a greater amplitude than this level will be clipped. The output appears across resistor 80. At a time that diode 60 is rendered non-conductive, any signal which is coupled from junction 57 to junction point 61 through the distributed capacitance in shunt with diode 60 will be bypassed to ground through diode 64 and capacitance 66, the latter elements providing a low impedance to such bypassing. As to that part of the input which will be passed through diode 60 when diode 60 is conductive, such input will not be bypassed to ground since diode 64 is so biased through its connection to the B+ source through resistors 71 and 72 that it will be non-conductive during the interval that diode 60 is conductive. Of course, the values of resistors 71 and 72 are so chosen that diodes 60 and 64 will be conductive and non-conductive respectively, simultaneously. Diode 62, of course, will conduct during those periods when junction point 61 is positive with respect to junction point 73 and diode 74 will be conductive when junction point 75 is positive with respect to junction point 73, junction point 75 normally being so positive due to its connection to the B+ source through resistors 68 and 71.

With the application of a negative input to the circuit of FIG. 4, diode 60 will obviously be conductive and diode 62 will be conductive until the negative signal passed through is of a sufficient amplitude to overcome the positive bias at junction point 61. While diode 62 is conductive, the voltage appearing at junction point 73 is sufficiently positive with respect to the voltage at point 75 so that diode 74 is maintained at cut-off. At the time that the signal appearing at point 61 goes sufficiently negative to cut diode 62 off, any negative signal coupled through the distributed capacitance in shunt therewith to point 73 is presented with a low impedance path to ground through diode 74 and capacitor 76. Thus, such unwanted signal also does not appear across resistor 80.

It is thus seen that with this invention there is provided a clipping circuit which provides sharp clipping at high frequencies and with abrupt wave forms and wherein the deleterious effect of the distributed capacitances of the series connected diodes in such circuit is substantially eliminated.

While there have been shown particular embodiments of this invention, it will, of course, be understood that it is not wished to be limited thereto since different modifications may be made both in the circuit arrangements and in the instrumentalities employed, and it is contemplated in the appended claims to cover any such modifications as fall within the true spirit and scope of the invention.

What is claimed as new and desired to secure by Letters Patent of the United States is:

1. A clipping circuit including series connected unidirectional conducting means, input terminal means for said clipping circuit having input signals impressed thereon for driving said undirectional means into conduction upon excursions of said signal in one direction from a reference voltage and to drive it into a nonconductive state upon excursions in the opposite direction, output terminal means for said clipping circuit adapted to have a load connected thereto, and means to prevent said input signals from being transmitted through the distributed capacitance of said unidirectional means while in its nonconducting state, said last named means including a path connected in shunt with said output terminals which presents a relatively high impedance to current flow at all times said unidirectional means is in its conductive state and a relatively low impedance to current flow at all times that said unidirectional means is in a nonconducting state.

2. A clipping circuit including first series connected unidirectional conducting means, input terminal means for said first unidirectional conducting means having input signals impressed thereon for driving said first unidirectional means into conduction upon excursions of said input signal in one direction from a reference voltage and for driving it into a nonconducting state upon excursions in the opposite direction, output terminals for said clipping circuit adapted to have a load means connected thereto, and means to prevent said input signals from being transmitted to said output terminals while said unidirectional means is in its nonconductive state, said last named means including second unidirectional means poled to be conductive when said first conductive means is in its nonconductive state and nonconductive when said first unidirectional means is in its conductive state.

3. A clipping circuit comprising first unidirectional conducting means, input terminal means for said clipping circuit for receiving input signals to drive said first unidirectional means into conduction upon an excursion of said input signal in one direction from a reference voltage point and to drive it into a nonconductive state upon an excursion in the opposite direction, means for clamping said input signal to a given voltage level, said clamping means being coupled to the input of said first unidirectional coupling means, means to prevent said input signals from being transmitted to said output terminals while said first unidirectional means is in its nonconductive state, said last named means including second unidirectional conducting means poled to be conductive when said first unidirectional means is in its nonconductive state and nonconductive when said first unidirectional means is in its conductive state whereby any signal coupled through the distributed capacitance of said first unidirectional means is diverted from said output terminals.

4. A clipping circuit as defined in claim 3 wherein said clamping means comprises a capacitance connected in series with the input of said first unidirectional conducting means and a series combination of a third unidirectional conducting means and a potential source having a voltage equal to said clamping level voltage connected between the junction of said capacitance and said input and a source of reference potential.

5. A clipping circuit as defined in claim 4 wherein said first, second and third unidirectional conducting means are diodes of the semi-conductor type.

6. A clipping circuit comprising first unidirectional means having an input and an output, said first unidirectional conducting means being so poled and having an operating point as to be conductive in response to inputs thereto having excursions in one direction from said operating point and to be non-conductive in response to inputs thereto having excursions from said operating point opposite to said one direction, second unidirectional conducting means in series arrangement with said first unidirectional conducting means, said second unidirectional conducting means having an operating point so as to be rendered substantially non-conductive in response to said first unidirectional conducting means being rendered conductive, first means connected between the junction of said first and second unidirectional conducting means and a source of reference potential which presents a high impedance to current flow when said first unidirectional conducting means is conductive and which presents a low impedance to current flow when said first unidirectional conducting means is non-conductive, a load impedance in the output of said second unidirectional conducting means, and second means in shunt with said load impedance which presents a high impedance to current flow when said second unidirectional conducting means is conductive and which presents a low impedance to current flow when said second unidirectional conducting means is non-conductive.

7. A clipping circuit as defined in claim 6 wherein said first means comprises a series arrangement of third unidirectional conducting means and a capacitance connected between the junction of said first and second unidirectional conducting means and a source of reference potential.

8. A clipping circuit as defined in claim 7 wherein said second means comprises a series arrangement of fourth unidirectional conducting means and a capacitance.

9. A clipping circuit as defined in claim 8 wherein said first, second, third, and fourth unidirectional conducting means are diodes of the semi-conductor type.

References Cited in the file of this patent

UNITED STATES PATENTS

| | | |
|---|---|---|
| 2,594,449 | Kircher | Apr. 29, 1952 |
| 2,657,318 | Rack | Oct. 27, 1953 |
| 2,763,841 | Simkins | Sept. 18, 1956 |
| 2,765,115 | Beloungie | Oct. 2, 1956 |
| 2,812,451 | Curtis | Nov. 5, 1957 |
| 2,900,534 | Chater | Aug. 18, 1959 |